(12) United States Patent
Gregori et al.

(10) Patent No.: US 10,485,134 B2
(45) Date of Patent: Nov. 19, 2019

(54) POWER CONNECTOR WITH AIR FLOW PASSAGES

(71) Applicant: MOLEX INCORPORATED, Lisle, IL (US)

(72) Inventors: Timothy R. Gregori, Lockport, IL (US); Siow Pheng Goh, Singapore (SG); Robert Piszczor, Westchester, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/039,973

(22) PCT Filed: Dec. 16, 2014

(86) PCT No.: PCT/US2014/070565
§ 371 (c)(1),
(2) Date: May 27, 2016

(87) PCT Pub. No.: WO2015/095174
PCT Pub. Date: Jun. 25, 2015

(65) Prior Publication Data
US 2017/0006733 A1 Jan. 5, 2017

Related U.S. Application Data

(60) Provisional application No. 61/917,181, filed on Dec. 17, 2013.

(51) Int. Cl.
*H01R 13/00* (2006.01)
*H05K 7/20* (2006.01)
*H01R 12/00* (2006.01)
*H01R 12/72* (2011.01)
*H01R 13/514* (2006.01)

(52) U.S. Cl.
CPC ......... *H05K 7/20127* (2013.01); *H01R 12/00* (2013.01); *H01R 12/724* (2013.01); *H01R 13/514* (2013.01)

(58) Field of Classification Search
CPC ..... H01R 13/11; H01R 13/5227; H01R 12/00
USPC ................................ 439/178, 190, 205, 206
See application file for complete search history.

(56) References Cited

U.S. PATENT DOCUMENTS

| 6,319,075 B1 * | 11/2001 | Clark ................ H01R 13/11 439/65 |
| 7,354,282 B2 | 4/2008 | Margulis et al. |
| 7,976,317 B2 * | 7/2011 | Patel ............... H01R 12/7088 439/699.1 |
| 8,435,043 B2 | 5/2013 | Yu et al. |
| 8,932,082 B2 * | 1/2015 | Yu ..................... H01R 13/428 439/626 |

(Continued)

FOREIGN PATENT DOCUMENTS

| CN | 102769224 A | 7/2012 |
| CN | 202977823 U | 5/2013 |

*Primary Examiner* — Vanessa Girardi
(74) *Attorney, Agent, or Firm* — Molex, LLC (57) ABSTRACT

An electrical power connector includes a housing having channels formed in the housing from a mounting end to a mating end. The channels are configured to receive a first and second blade terminal having a flat contact with a wall disposed between the blade terminals. Projections are formed on the wall and the projections support the terminals while forming passages that allow air flow between the wall and the blade terminal in the channel.

6 Claims, 12 Drawing Sheets

(56) References Cited

U.S. PATENT DOCUMENTS

| | | |
|---|---|---|
| 9,054,448 B2 * | 6/2015 | Yu .......................... H01R 12/58 |
| 2001/0003685 A1 | 6/2001 | Aritani |
| 2008/0207029 A1 | 8/2008 | Defibaugh et al. |
| 2009/0142953 A1 | 6/2009 | Patel et al. |
| 2010/0081340 A1 | 4/2010 | Fogg |

\* cited by examiner

POWER CONNECTOR WITH AIR FLOW PASSAGES

RELATED APPLICATIONS

This application claims priority to International Application No. PCT/US2014/070565, filed Dec. 16, 2014, which claims priority to U.S. Provisional Application No. 61/917,181, filed Dec. 17, 2013, both of which are incorporated herein by reference in their entirety.

FIELD OF THE INVENTION

This application relates to field of power connectors, more specifically to low profile circuit board connectors.

DESCRIPTION OF RELATED ART

Generally, an electrical connector includes a housing formed of an insulative material that supports one or more conductive terminals. The housing is configured for mating with a complementary mating connector or other connecting device which, itself, has one or more conductive terminals. A connector assembly typically includes a pair of mating connectors, such as plug and receptacle connectors sometimes called male and female connectors of which, corresponding terminals of the connectors, themselves, may be male and female terminals.

One issue that is commonly present in equipment using power connectors under high current conditions is the buildup of heat within the power connector connecting such devices. As is known, current flowing along a path between a mating female and male contact will generate heat at the point of contact. Excessive buildup of heat can cause increased resistance between the points of contact in the terminal system therefore decreasing performance and increasing power consumption of the connection system and eventually leading to failure of the equipment. Certain individuals would therefore appreciate a connection system that provides a cost effective and reliable way of reducing the heat buildup in a connection system without the need for increased space and secondary heat removing devices.

BRIEF SUMMARY

A connector assembly is provided that includes a plug connector and a receptacle connector. The connector assembly includes one or more blade terminals retained in the plug connector and multiple-pronged terminals on the receptacle connector for transmitting power. The plug connector includes signal terminals mounted within a signal wafer and held in a shrouded area of the connector. The receptacle connector also includes a mating signal wafer that is slidably mateable with the signal wafer of the plug connector.

The blade terminals are mounted in a channel formed in the housing of the plug connector and the channel includes a wall that is disposed between adjacent blade terminals. Spaced apart projections are formed on the wall and engage sections of the blade terminals positioned on both sides of the wall and a flat contact of the blade terminal engaging the projections. The projections combined with the flat contact create passages defined between each conductive blade terminal and the wall allowing air to flow around the power contacts.

BRIEF DESCRIPTION OF THE DRAWINGS

This application is illustrated by way of example and not limited in the accompanying figures in which like reference numerals indicate similar elements and in which.

DETAILED DESCRIPTION

FIGS. 1-13 illustrate embodiments of the disclosure and it is to be understood that the disclosed embodiments are merely exemplary. Therefore, specific details disclosed herein are not to be interpreted as limiting, but merely as a basis for the claims and as a representative basis for teaching one skilled in the art to variously practice the disclosure.

As can be appreciated by the disclosure that follows, the disclosure generally relates to a connector that can combine substantial electrical power delivery and signal delivery in a connector system and that can provide excellent operation under high current density conditions. One or more embodiments of the present disclosure utilizes multiple both signal and power circuits in a connector system that provide proper alignment, mechanical connection and electrical connection, while providing a low profile connection. If desired the configuration can be modified to provide board-to-board, wire-to-board and wire-to-wire connection.

As illustrated in the FIGS. 1-12, an embodiment of a board-to-board connector assembly 10 includes a plug connector 30 and receptacle connector 80. For simplicity, the plug connector 30 and receptacle connector 80 will be respectively referred to as plug 30 and receptacle 80. The plug 30 includes a housing 32 and receptacle 80 includes a housing 82 and the housings 32, 82 can be formed from an insulative material. As depicted, a board to board arrangement is depicted with a receptacle 80 having what is commonly referred to as a vertical configuration and the plug 30 having a right angle configuration, but alternate arrangements could provide a receptacle 80 with a right angle configuration.

As shown, the connector 30 a plurality of signal wafers 24, each signal wafer having a plurality of signal terminals 26 molded therein and the signal wafers 24 are positioned in a receiving bay 29 such that contacts 26*a* positioned in a shroud 28 formed in the plug 30. In the embodiment shown, a group of signal wafers 24 are positioned in a receiving bay 29 formed in the housing 32 and secured in the housing by a snap fit and an optional stiffener. In an embodiment, multiple receiving bays 29 may also be formed in the housing 32 with a set of signal wafers 24 received in each receiving bay 29.

Typically, the individual connecting portions 20, 22 are arranged in a linear array in a side by side relationship. A power portion 22 includes a blade terminal 36 that is sized according to the current carrying capabilities of the circuit requirements, for instance, circuits requiring higher current will include power contacts having a substantially large blade terminal 36 thereby providing a greater surface area allowing for the transmission of greater current. As best shown in the FIGS. 2-5, each power portion 22 includes a pair of blade terminals 36 arranged in a back-to-back relationship with a wall 38 positioned between the blade terminals 36. As further shown in FIGS. 2-4 the plug 30 includes a plurality of blade terminals 36 retained in a housing 32 alternatively, another embodiment (not shown) may include a separate module that holds the blade terminals 36 and each module being inserted and retained in the housing 32. As best shown in FIG. 4 the blade terminals 36 are arranged in a back to back relationship in each power portion 20 and include a wall 38 formed in the housing 32 separating each blade terminal 36 and spaced between each respective blade 36. Similarly a mating receptacle 80 is provided including a housing 82 that retains a corresponding number of mating power contacts 84 that connect to each respective blade terminal 36 of the plug 30. Additionally, corresponding signal wafers 86 held within the receptacle 80 mate with the signal wafers 24 of the plug 30.

Figure 6:
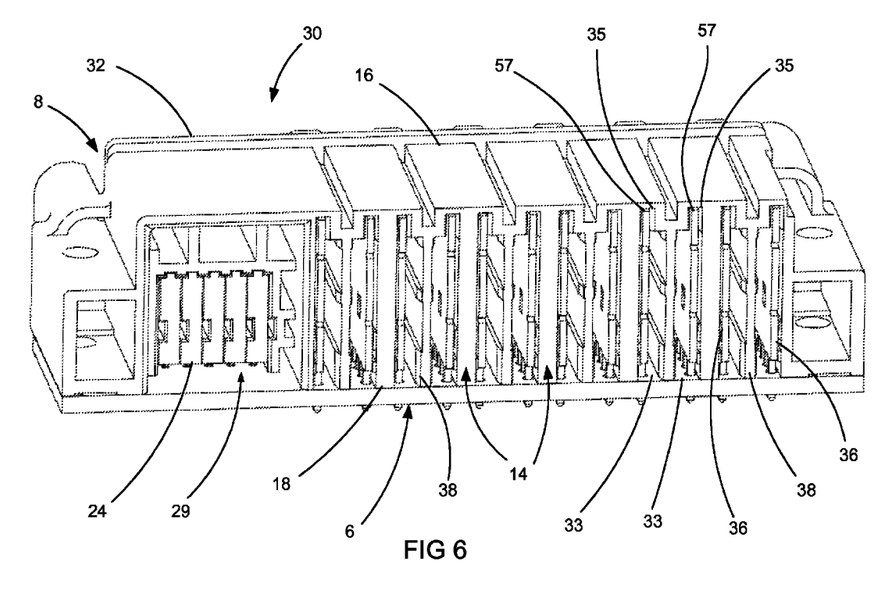
FIG. 6 is a perspective view of the mounting end of the plug connector.
Figure 7:
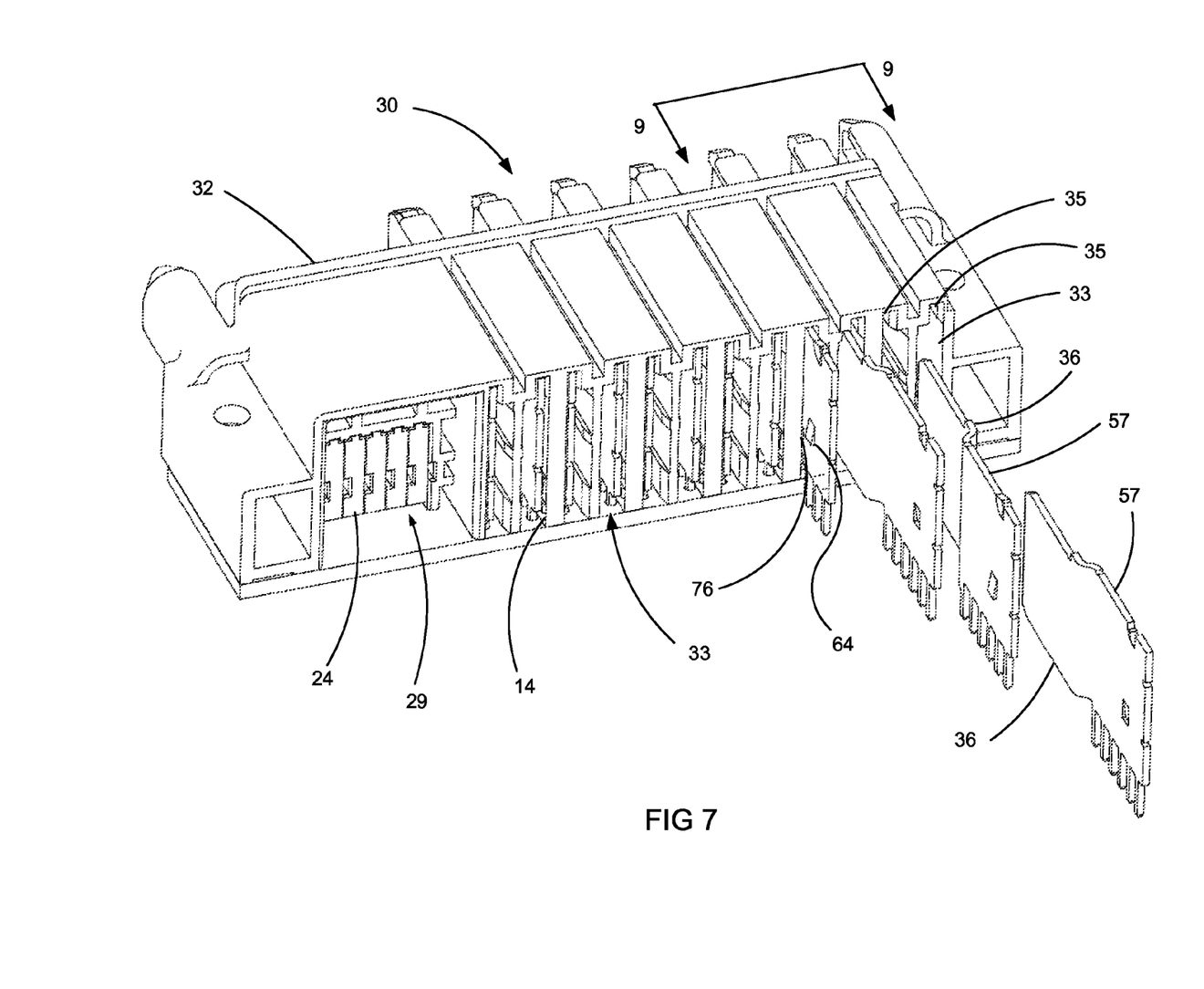
FIG. 7 is a partially exploded view of the plug connector of FIG. 6.

As best illustrated in FIGS. 6-7 each blade terminal 36 is positioned in the insulative housing 32 and securely retained therein. The housing 32 includes a mounting end 6 and a mating end 8 with the mating end 8 configured to cooperatively connect to the corresponding receptacle 80 and the mounting end 6 is configured to be mounted on a printed circuit board 2. The housing 32 is molded from an insulative material and includes a top wall 16 and bottom wall 18 connected together by a two or more vertical walls 14. The vertical walls 14 define one or more channels 33 that extend through the housing 32 from the mounting end 6 to the mating end 8 and a wall 38 is positioned in each channel 33. At an end of the housing 32, a shroud 28 is formed having a receiving bay 29 for retaining respective signal wafers 24 therein.

Figure 8:
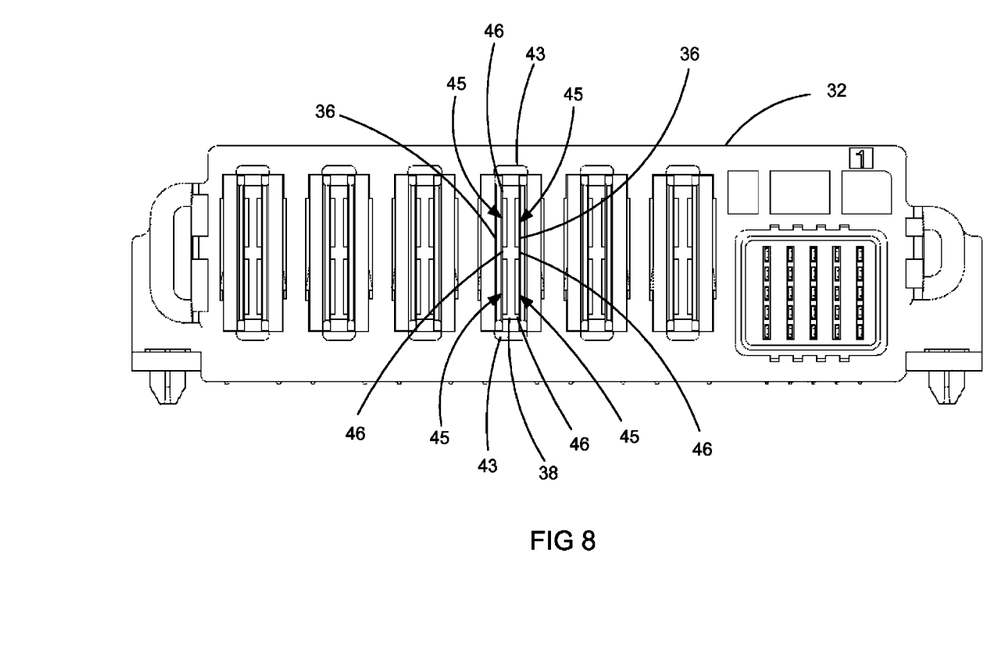
FIG. 8 is a mating end elevation view of the plug connector.
Figure 9:
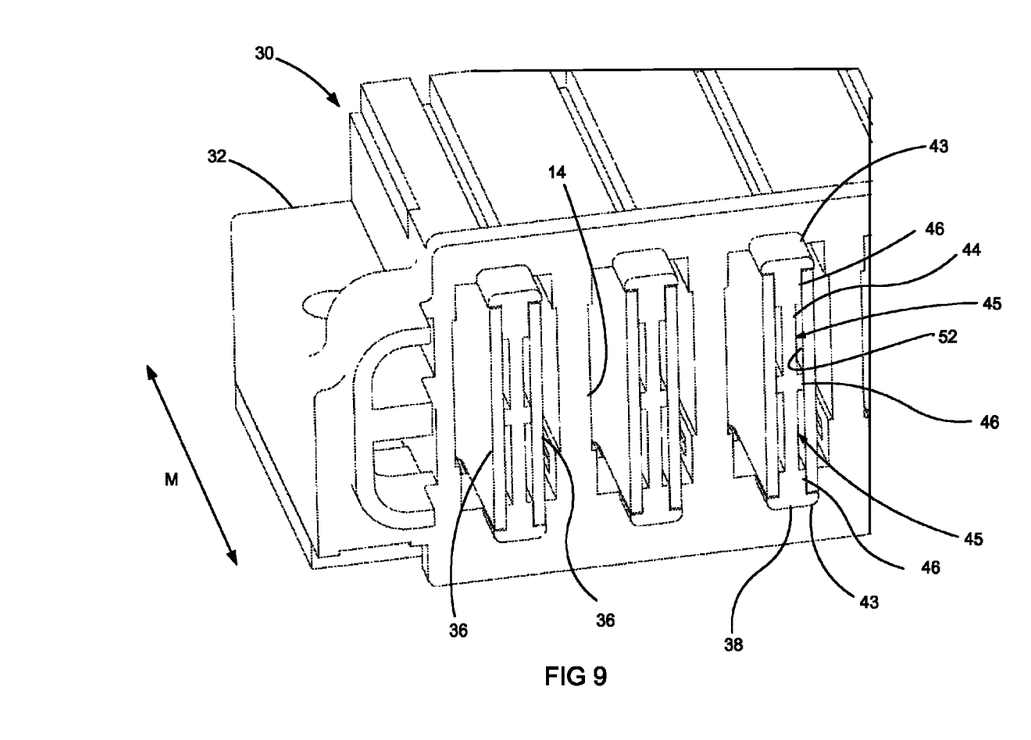
FIG. 9 is a partial sectional view of the mating end of the plug connector.
Figure 13:
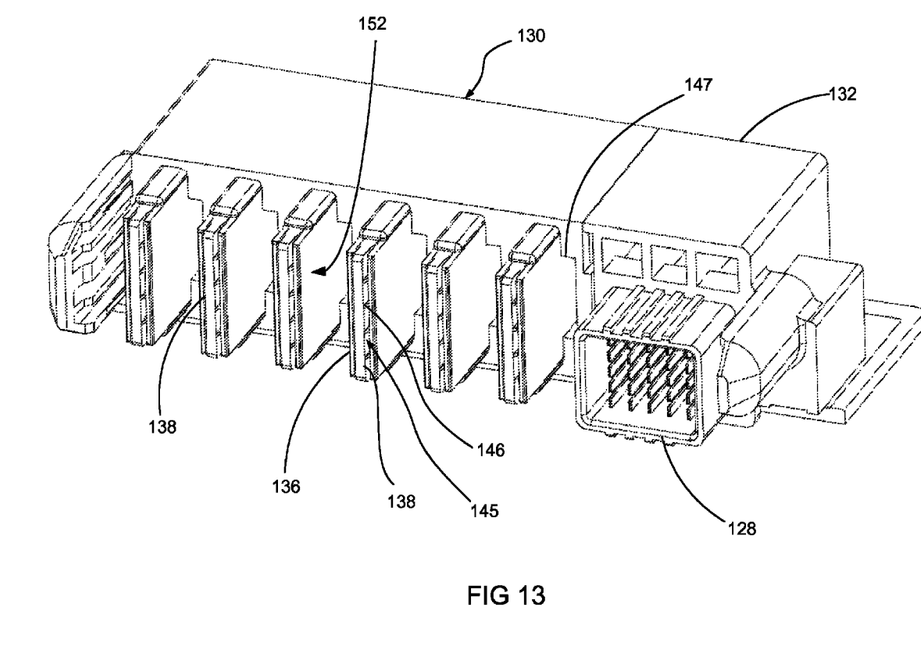
FIG. 13 is a perspective view of an alternative embodiment of the plug connector.

As shown in FIGS. 8-9 the wall 38 is positioned between adjacent blade terminals 36 of each power potion 20 with each wall 38 having a projections formed therein. Each projection 46 extends along a mating direction M on each respective side of the wall 38 and in combination with the flat contact 52 of the blade terminal 36 inserted into the channel 33, each projection 46 and flat contact 52 creates an enclosed passage 45 extending through the housing 32. The enclosed passage 45 allows air to flow through the passage 45 and cool the inner flat contact 52 of the blade terminal 36 by transferring heat away from the blade terminal 36. As shown in FIG. 13 an alternative embodiment is shown in which the wall 138 has seven projections that together with the flat contact of blade terminal 136 form five passages 145 on each side of the wall 138.

In addition to the passages 145 formed between the wall 138 and the flat contact 152 of the blade terminal 136, after insertion of the blade terminals 136 in the channels, an additional air space 147 remains in each channel exposing the opposite side of the flat contact 152 of the blade terminals 136 providing air flow through this part of the connector housing 132.

Figure 10:
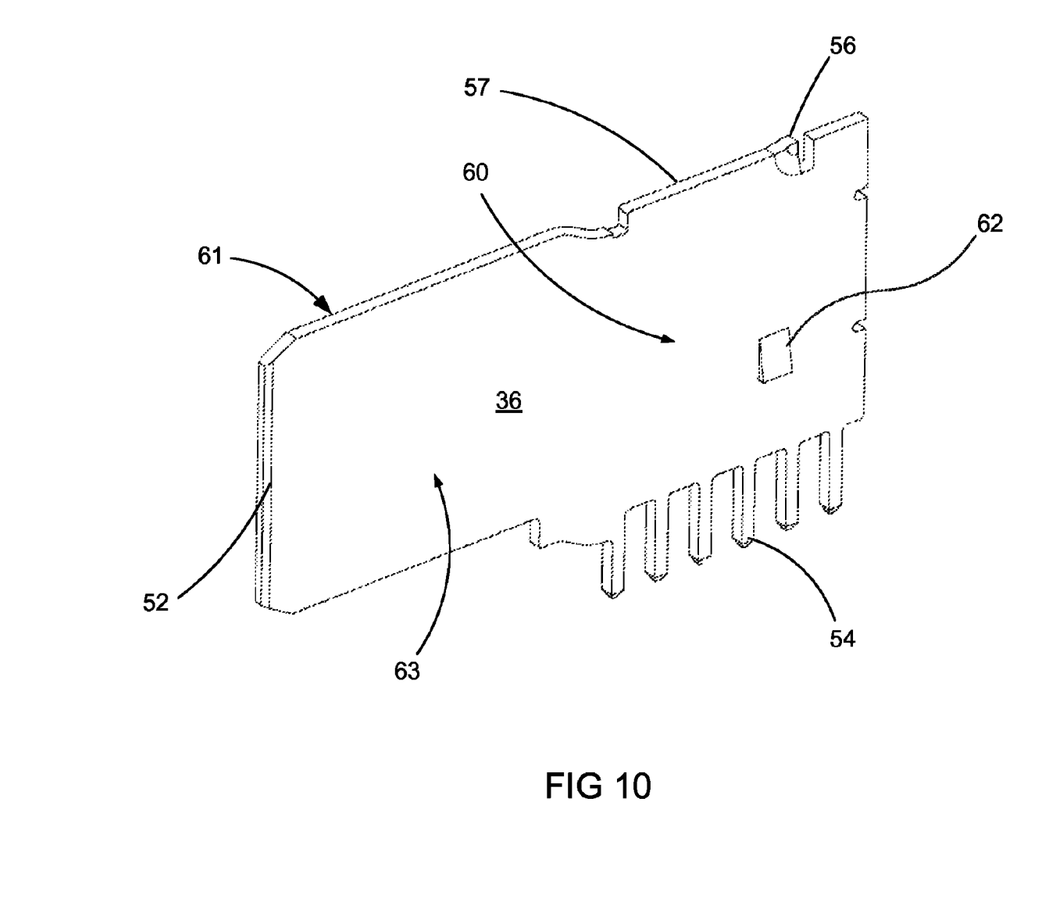
FIG. 10 is a perspective view of the blade terminal of the plug connector.
Figure 11:
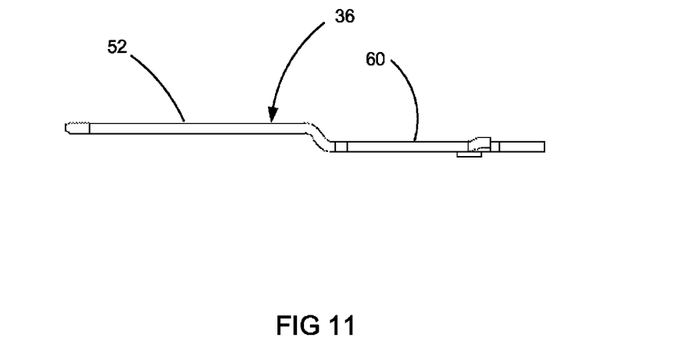
FIG. 11 is a top view of the blade terminal of FIG. 10.
Figure 12:
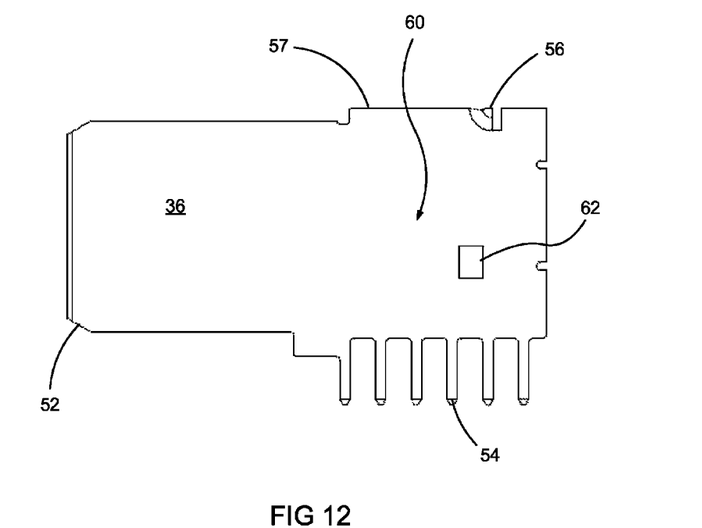
FIG. 12 is a side view of the blade terminal of FIG. 10.

As illustrated in FIGS. 10 and 11 the flat contact 52 of the blade 36 is offset from the body 60 with the flat contact 52 of the blade terminal 36 having an first side 61 and a second side 63. As previously described, the blade terminals 36 are arranged in a back-to-back relationship, that is, upon assembly the first sides 61 of corresponding terminals 36 are in facing relationship while the respective second sides 63 are facing away from each other. It is understood that corresponding blade terminals 36 of each power portion 20 contains geometry that is a mirror each other due to the offset between the flat contact 52 and body 60.

As best shown in FIGS. 6-7 the blade terminals 36 are arranged in a back-to-back relationship and inserted into from the mounting end 6 of the housing 32 into corresponding channels 33. A first blade terminal 36 is inserted in to the channel 33 along the first side 38a of the wall 38 and a second blade terminal 36 is inserted into the channel 33 along the second side 38b of the wall 38. The blade terminals 36 are inserted along the entire length of the wall 38 and extend beyond the mating end 6 of the housing 32. Additional channels 33 include walls 38 positioned vertically in the respective channels extend through the housing 32 from the mounting end 6 to the mating end 8 of the housing 32 with a portion of the these walls 38 extending beyond the mating end 8 of the housing 32.

As further illustrated in FIGS. 8-9 a plurality of projections 46 are formed on each of the first side 38a and the second side 38b of the wall 38. Each side 38a, 38b of the wall 38 includes at least two projections 46 that engage the flat contact 52 of the blade terminal 36. As shown in FIG. 9 a projection 46 is positioned at the top and bottom portions of the wall 38 with an additional projection 46 positioned between. Additionally, a cap 43 is also provided at the top and bottom portions of the wall that respectively engage the edges of the blade terminals 36 received in the channels.

During insertion of the blade terminals 36 the edge 64 of locating tab 62 is aligned with the shoulder 76 formed in the channel 33 of the housing 32 positioning each blade terminal 36 in the channel 33. The top edge 57 of each blade terminal 36 can be inserted into locating groove 35 formed at the top of each channel 33 and the locating groove 35 helps guide and aligns the blade terminal 36 in the channel 33. Upon complete insertion of the blade terminal 36, the top edge 57 of each inserted blade terminal 36 is disposed in each respective locating groove 35 so that the locking tab 56 engages the locating groove 35 and helps secure the blade terminal 36 in the housing 32.

In operation power connectors requiring larger current capacities also are faced with the potential of heat buildup that can affect performance and damage the connector system 10. The heat has to be efficiently transferred away from the connector and is accomplished by forcing air or other cooling medium through the connector to dissipate the heat. The heat is generally concentrated at the point of increased electrical resistance which would in this case be the point of electrical contact between the respective mating electrical terminals of the connected plug and receptacle.

As depicted, the wall 38 is positioned between adjacent blade terminals 36 and each wall 38 has projections 46 formed therein. The projections 46 extend out from the wall 38 and support the blade terminals 36 on each respective side of the wall 38. As the blade terminals 36 are spaced apart from the wall 38 by the projections 46, a passage 45 is formed between the blade terminal 36 and the wall 38 and the passage 45 extends through the housing 32. The passage 45 allows air to flow along the blade terminal 36, allowing convection to remove heat from the blade terminal 36 and to help keep the blade terminal 36 cool.

In an alternative embodiment, as depicted in FIG. 13, a wall 138 has multiple projections 146 that together with blade terminal 136 form multiple passages 145 on each side of the wall 138.

In addition to the passages 145 formed between the wall 138 and the blade terminal 136, after insertion of the blade terminals 36 in the housing 132 an additional air space 147 can be provided that exposes the opposite side of the blade terminals 136 and this can provide addition cooling of the blade terminal 136.

Figure 1:
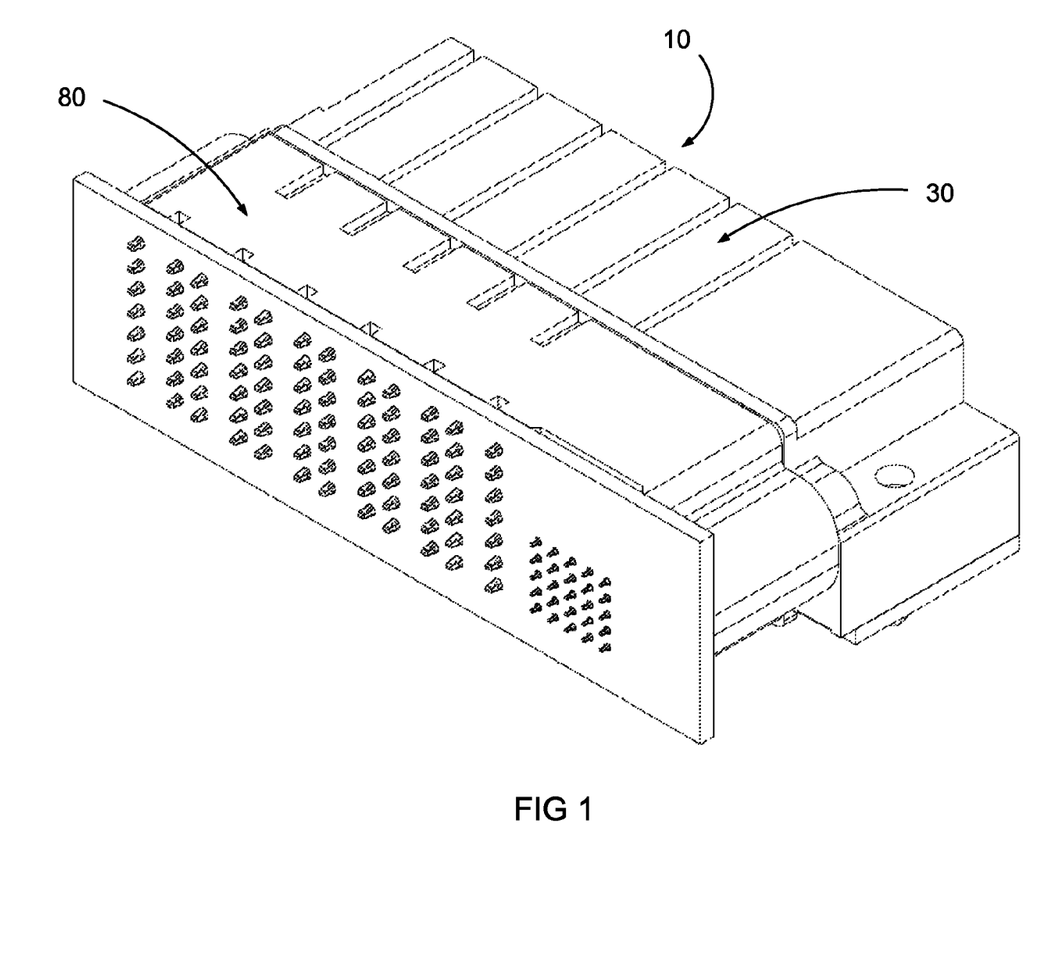
FIG. 1 is a perspective view of a power connector.
Figure 2:
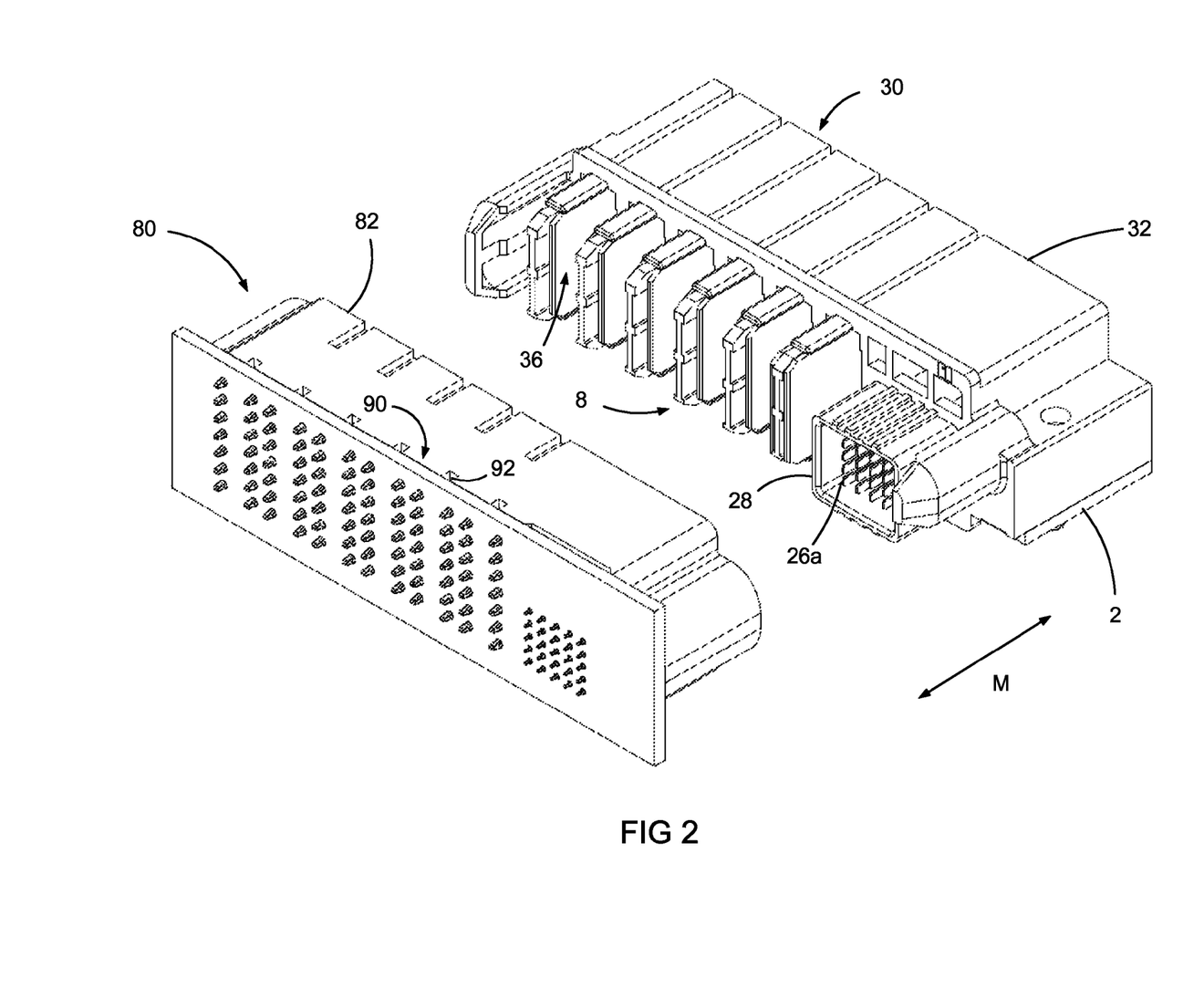
FIG. 2 is an exploded perspective view of the power connector of FIG. 1.
Figure 3:
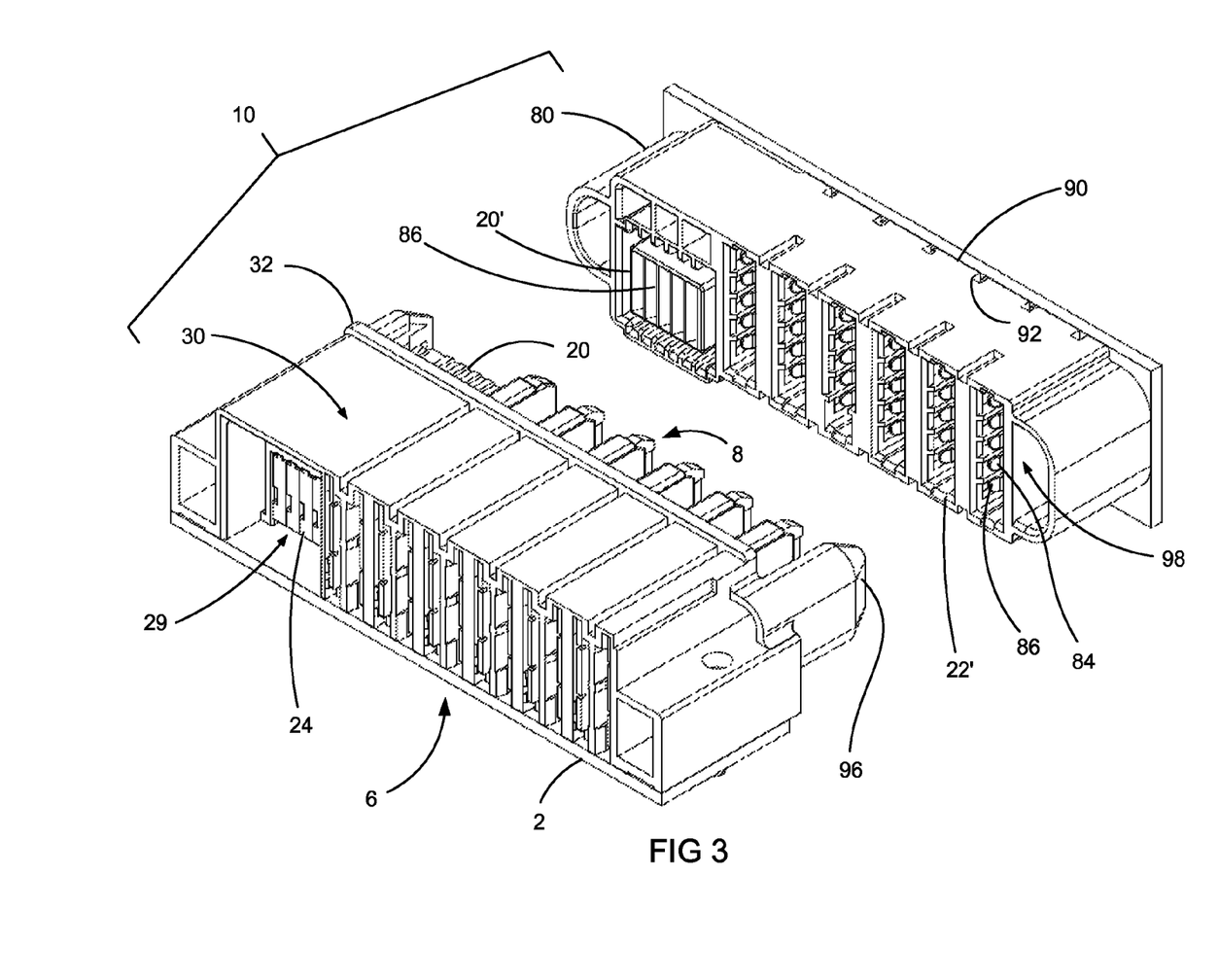
FIG. 3 is an alternative perspective view of the power connector of FIG. 1.
Figure 4:
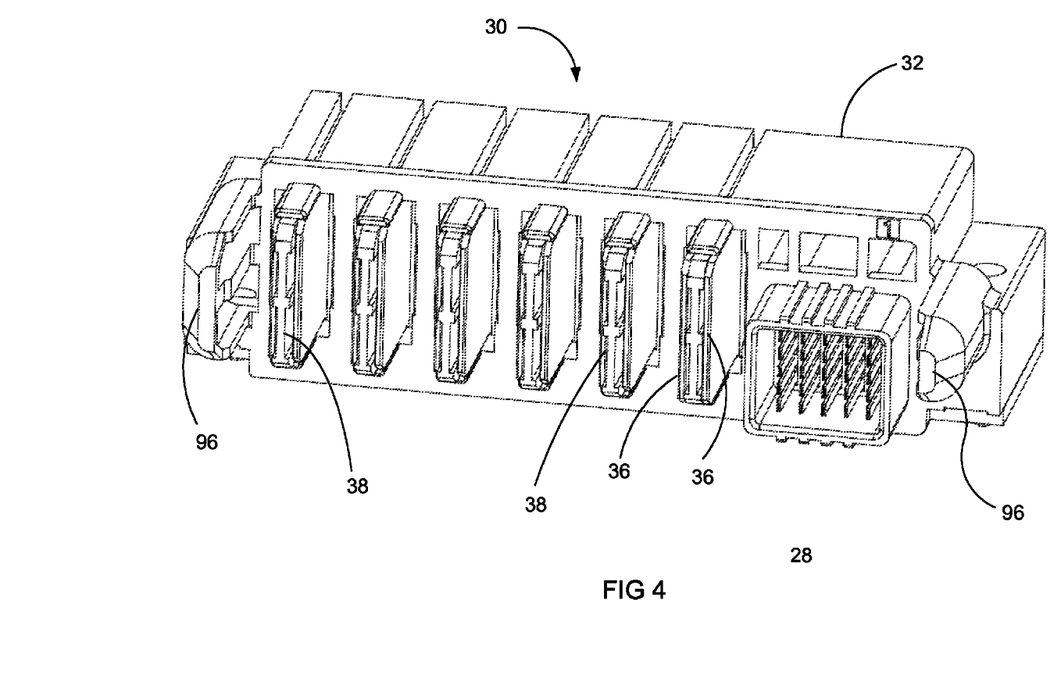
FIG. 4 is a perspective view of the mating end of the plug connector of FIG. 1.
Figure 5:
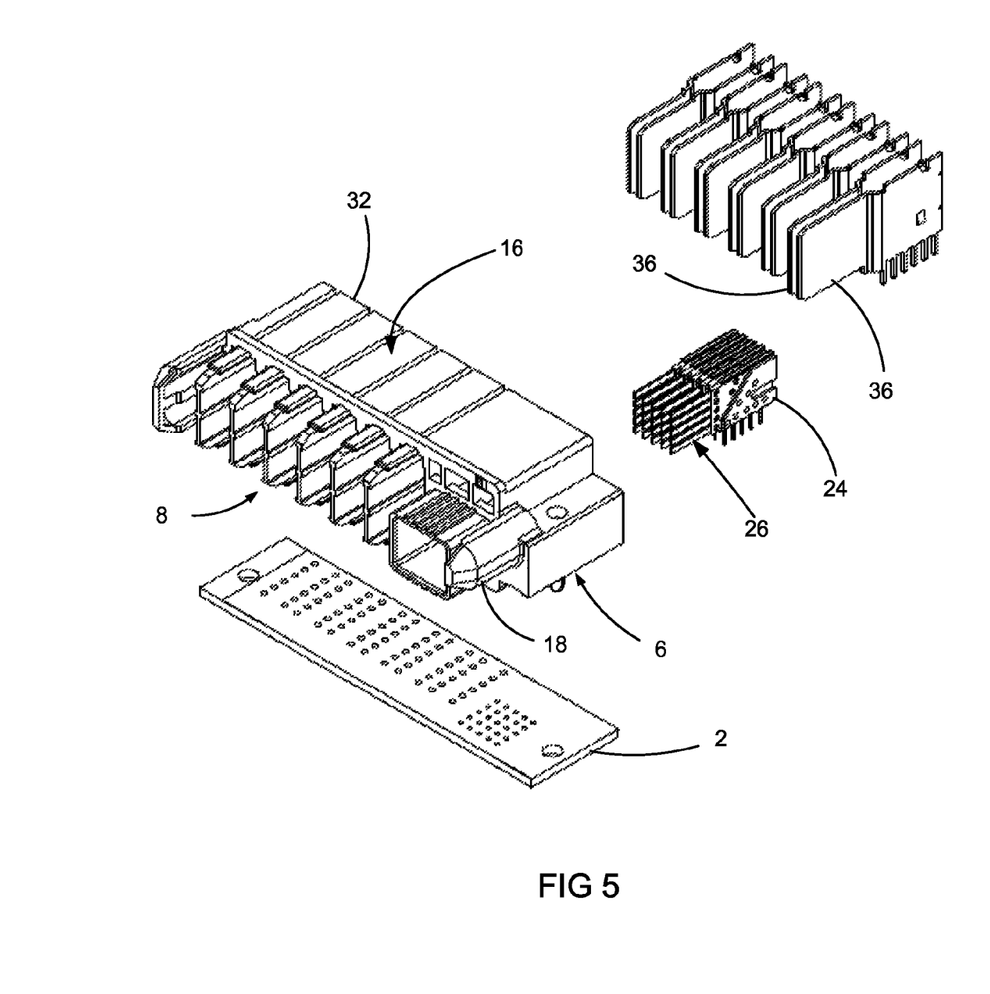
FIG. 5 is an explode view of the plug connector.

As best shown in FIGS. 2-3 the receptacle 80 has a plurality of standoffs 90 formed at the bottom of the housing 82 that maintains the housing 82 a distance off the printed circuit board on which it is mounted. Ports 92 are formed between the standoffs 90 allowing air to flow through the housing 82 and through the spring fingers 86 of the mating power contacts 84 providing a connector system 10 cooling solution.

The end configurations of the connector system 10 include an alignment structure to guide the connector system 10 together preventing stubbing between the plug 30 and receptacle 80 and the terminals contained therein. The alignment structure typically includes one or more guiding posts 96 and matching recesses 98 having cooperating tapered ends to provide a lead in during connector mating. Various keying features may also be included to insure that mis-mating will not occur. This arrangement allows for any number of signal and power configurations in a low profile form factor.

It should be noted that in general, while plug connectors and receptacle receptors have been described as having certain features, the depiction of whether a connector is a plug or receptacle type in the figures is done merely for illustrative purposes. Typically a receptacle is considered to have terminals/contacts that deflect while the plug is considered to have terminal/contacts that cause deflection. Naturally a person of skill in the art could configure a connector system so as to substitute receptacle contacts for plug contacts. Therefore, it is envisioned that a particular connector could be configured to be a plug or a receptacle type or a combination of plug and receptacle, as desired. For example, a connector could include a power contact that is a plug type or a receptacle type and also include a signal contact that is a plug type or a receptacle type. Therefore, unless otherwise noted, whether a terminal has a contact that makes it a receptacle or plug is not intended to be limiting.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A connector, comprising:
a housing having a mating end and a mounting end, the housing including at least one channel that extend through the housing from the mounting end to the mating end, each channel is defined by a top wall and a bottom wall and a pair of vertical walls connecting the top and bottom walk together, a wall is positioned in at least one channel between the vertical walls, the wall extending from the mounting end to the mating end, the wall having a first side and a second side, the wall having two projections provided on the first side and two projections positioned on the second side;
a first terminal having a flat contact mating end that is supported by the projection on the first side of the wall defining a first passage between the first side of the wall and one side of the first terminal and further definin an air space between one of the vertical walls and an opposite side of the first terminal; and
a second terminal having a flat contact mating end that is supported by the projections on a second side of the wall defining a second passage between the second side of the wall and one side of the second terminal and further defining an air space between one of the vertical walls and an opposite side of the second terminal.

2. The connector of claim 1, wherein the flat contact of the terminal is offset from the tail.

3. The connector of claim 1, wherein a signal wafer is mounted in the housing.

4. The connector of claim 1, wherein the wall is positioned vertically in the channel of the housing.

5. The connector of claim 1, wherein the wall extends beyond the mating end of the housing.

6. The connector of claim 5, wherein a cap is formed on the wall that extends beyond the mating end.

* * * * *